United States Patent [19]

Jones et al.

[11] Patent Number: 4,872,505
[45] Date of Patent: Oct. 10, 1989

[54] HEAT SINK FOR AN ELECTRONIC DEVICE

[75] Inventors: Jack E. Jones, Casselberry; David J. Bulmahn, Winter Springs, both of Fla.

[73] Assignee: NCR Corporation, Dayton, Ohio

[21] Appl. No.: 232,821

[22] Filed: Aug. 16, 1988

[51] Int. Cl.[4] .......................................... H02L 23/40
[52] U.S. Cl. ................................ 165/80.3; 165/185; 174/16.3; 361/386
[58] Field of Search .............................. 361/386, 388; 174/16 HS; 165/80.2, 80.3, 185; 357/81

[56] References Cited

U.S. PATENT DOCUMENTS

| | | | |
|---|---|---|---|
| 3,558,994 | 4/1969 | Bernstein | 165/80.3 |
| 3,572,428 | 3/1971 | Monaco | 165/80.3 |
| 3,670,215 | 6/1972 | Wilkens et al. | 317/23 |
| 3,852,643 | 12/1974 | Seki et al. | 361/388 |
| 3,893,161 | 7/1975 | Pesak, Jr. | 165/80.3 |
| 4,235,285 | 11/1980 | Johnson et al. | 165/80.3 |
| 4,261,005 | 4/1981 | McCarthy | 165/80.3 |
| 4,544,942 | 10/1985 | McCarthy | 357/81 |
| 4,605,058 | 8/1986 | Wilens | 165/80 |
| 4,709,302 | 11/1987 | Jordan et al. | 361/388 |
| 4,729,426 | 3/1988 | Hinshaw | 165/80.3 |

FOREIGN PATENT DOCUMENTS 3203609  8/1983  Fed. Rep. of Germany .

OTHER PUBLICATIONS

AAVID Engineering, Inc., "Heat Sinks and Accessories", Catalogue 1100, 1985, pp. 28 & 33.

Primary Examiner—James C. Yeung
Assistant Examiner—Christopher Hayes
Attorney, Agent, or Firm—Wilbert Hawk, Jr.; Stephen F. Jewett; Douglas S. Foote

[57] ABSTRACT

A heat sink for conducting heat from an electronic device is disclosed. The device has a mounting base and two U-shaped members. Each U-shaped member has first and second walls integral with a top ridge. The first wall is integral with the base and extends away from the base and the second wall has a terminus portion proximate the first wall. Each U-shaped member is adapted to retain an electronic device between the first wall and the terminus portion.

17 Claims, 2 Drawing Sheets

HEAT SINK FOR AN ELECTRONIC DEVICE

The present invention relates to means for supporting and conducting heat from an electronic device. More particularly, but not by way of limitation, it relates to heat sinks which have improved heat transfer characteristics and an improved mounting configuration onto a printed circuit board.

BACKGROUND OF THE INVENTION

Certain electronic devices generate excess heat during operation. In order to cool such devices heat sinks are frequently provided to conduct heat from the device and dissipate it into the surrounding environment. An airflow may also be provided to enhance the cooling effect. For electronic devices assembled on a printed circuit board, it is known to mount a heat sink onto the circuit board and fasten or secure the electronic device to the sink.

It is desirable to have a heat sink with a configuration which provides good thermal contact with the electronic device and which provides a high rate of convection or radiation. However, when more than one such heat sink is mounted onto a circuit board the sinks may mutually interfere with one another. For example, when the sinks are aligned with respect to the airflow over the board, upstream heat sinks may block the cooling flow to downstream sinks.

Mounting heat sinks to a circuit board can be problematic in that the sink must be accurately positioned and should be stable during the assembly process. However, the effectiveness of the design should not be sacrificed for ease of assembly.

OBJECTS OF THE INVENTION

It is therefor an object of the present invention to provide a new and improved heat sink for an electronic device.

It is another object of the present invention to provide a heat sink with improved radiation and convection characteristics.

It is yet another object of the present invention to provide a heat sink with reduced blockage to air flowing therethrough.

It is a further object of the present invention to provide a heat sink with improved stability for mounting onto a circuit board.

It is yet a further object of the present invention to provide a heat sink with means for securing an electronic device thereto, the means having improved heat transfer characteristics.

SUMMARY OF THE INVENTION

The present invention is a heat sink for conducting heat from an electronic device. The device comprises a mounting base and two U-shaped members. Each U-shaped member has first and second walls integral with a top ridge. The first wall is integral with the base and extends outwardly therefrom. The second wall has a terminus portion proximate the first wall. The electronic device is retained between the first wall and the terminus portion of one of the U-shaped members for heat conduction from the device directly into the first and second walls.

DETAIL DESCRIPTION OF THE INVENTION

Figure 1:
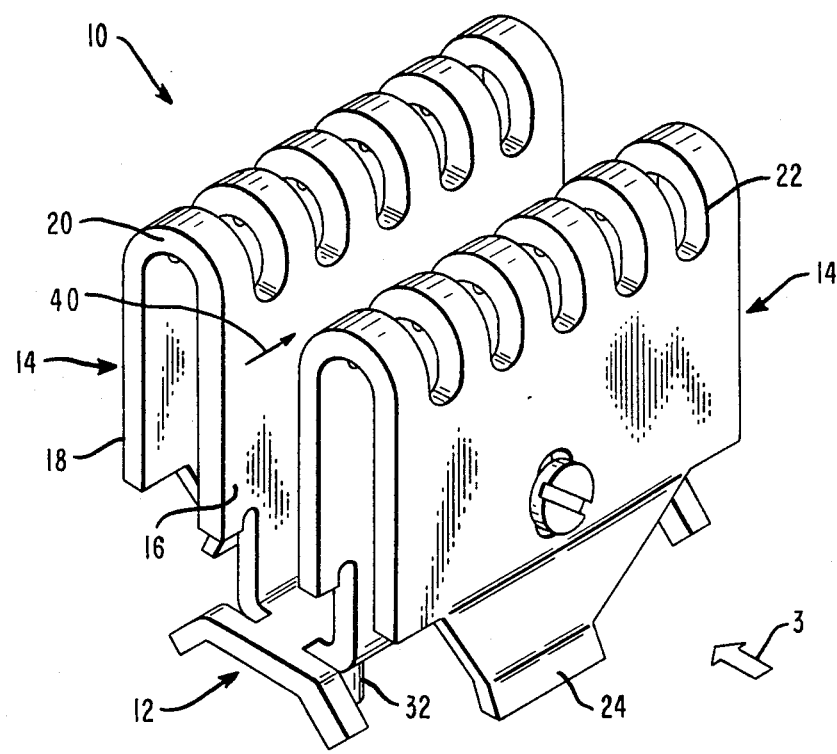
FIG. 1 is a perspective view of a heat sink according to one form of the invention.

FIG. 1 shows a heat sink 10 according to one form of the present invention. Heat sink 10 has a mounting base 12 and two U-shaped members 14. Each member 14 has walls 16 and 18 integral with a top ridge 20. Wall 16 is typically formed integral with base 12 and extends outwardly therefrom in an upward direction. Top ridge 20 has a plurality of slots 22 cut therein to allow for improved natural convection cooling of an electronic device (shown and described in FIG. 2). Wall 18 extends generally downward and terminates with a terminus portion 24. Terminus portion 24 is proximate wall 16 so that an electronic device may be retained therebetween.

Figure 2:
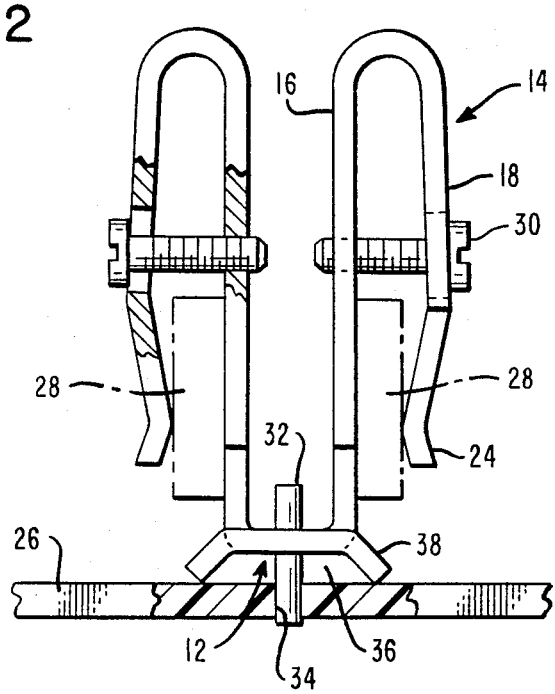
FIG. 2 is a partially sectioned end view of the heat sink of FIG. 1 mounted on a circuit board and securing two electronic devices.

FIG. 2 shows a view of heat sink 10 mounted on a circuit board 26 and securing two electronic devices 28. A screw 30 passes through each wall 18 and taps into wall 16 thereby connecting walls 16 and 18 and securing device 28 between wall 16 and terminus portion 24. Other means for securing device 28 are within the scope of the present invention. For example, U-shaped member 14 could be spring loaded. The securing of device 28 is required for good contact so that heat is conducted from device 28 directly into both walls 16 and 18.

Pins 32 are attached to base 12 and extend outwardly therefrom in a downward direction. Each pin 32 passes through a hole 34 in circuit board 26. Where it emerges from hole 34, pin 32 can be bonded to board 26 by conventional means, such as wave soldering. In a preferred embodiment of the invention, two pins 32 are used (see FIGS. 2 and 3). However, one or more than two pins may alternatively be employed.

Figure 3:
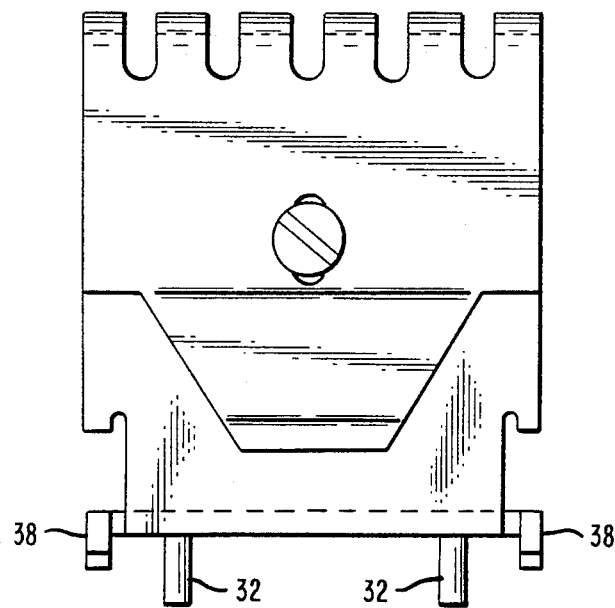
FIG. 3 is a side view of the heat sink taken along arrow 3 in FIG. 1.

In order to prevent base 12 from coming into direct contact with circuit board 26 when it is mounted thereon, standoff means are provided to provide a space 36 between base 12 and board 26. As shown in FIGS. 2 and 3, the standoff means includes four tabs 38 which extend away from base 12 in a generally downward direction. During the soldering of pins 32 to circuit board 26 heat sink 10 must be held in place. Tabs 38 provide the necessary stability.

In operation, heat sink 10 will be positioned so that the airflow will be in the direction shown by arrow 40 in FIG. 1. As is evident, the end profile of heat sink 10 "seen" by the airflow (see FIG. 2) is limited to the thickness of the devices 28, mounting base 12 and U-shaped members 14. This provides reduced blockage to cooling airflow through heat sink 10. This is particularly useful for applications where more than one heat sink 10 is aligned with respect to the airflow so that minimum airflow blockage is achieved.

The invention is also particularly effective in removing heat from device 28. By having both wall 16 and terminus portion 24 of wall 18 contact device 28 two separate paths for heat conduction from device 28 are provided. Heat sink 10 will thus have increased capability of removing heat from an electronic device than prior art heat sinks which simply attach a device to one surface by means of a clip. Slots 22 also improve the natural convection cooling by allowing hot air to escape through top ridge 20.

It will be understood that the dimensions and proportional and structural relationships shown in the drawings are illustrated by way of example only and these illustrations are not to be taken as the actual dimensions or proportional structural relationships used in the heat sink of the present invention.

Numerous modifications, variations, and full and partial equivalents can be undertaken without departing from the invention as limited only be the spirit and scope of the appended claims.

What is desired to be secured by Letters Patent of the United states is as follows.

What is claimed is:

1. A heat sink for conducting heat from an electronic device comprising:
   a base for mounting said heat sink to a board; and
   means for retaining an electronic device; said means including a U-shaped member having first and second walls connected by a top ridge, said first wall being integral with said base and extending outwardly therefrom and said second wall having a terminus portion proximate said first wall;
   wherein an electronic device is retainable between said first wall and terminus portion for heat conduction from said device directly into said first and second walls.

2. The heat sink of claim 1 wherein said top ridge has a plurality of slots cut therein.

3. The heat sink of claim 1 further comprising:
   securing means for securing said device between said first wall and said terminus portion.

4. The heat sink of claim 3 wherein said securing means comprises a screw connecting said first and second walls.

5. The heat sink of claim 1 further comprising:
   fastening means for attaching said base to a circuit board.

6. The heat sink of claim 5 wherein said fastening means includes at least one pin attached to said base and extending outwardly therefrom in a second direction opposite said first wall.

7. The heat sink of claim 6 further comprising:
   standoff means for maintaining a space between said base and said board when said sink is mounted on said board.

8. The heat sink of claim 7 wherein said standoff means includes four tabs extending away from said base in said second direction.

9. A heat sink for conducting heat from an electronic device comprising:
   a mounting base;
   two U-shaped members, each having first and second walls integral with a top ridge which has a plurality of slots cut therein, said first wall being integral with said base and extending outwardly therefrom and said second wall having a terminus portion proximate said first wall;
   securing means for securing an electronic device between said first wall and terminus portion of one of said U-shaped members for heat conduction from said device directly into said first and second walls;
   fastening means for attaching said base to a circuit board; and
   standoff means for maintaining a space between said base and said board when said sink is mounted on said board.

10. The heat sink of claim 9 wherein said fastening means includes at least one pin attached to said base and extending outwardly therefrom in a second direction opposite said first wall, and wherein said standoff means includes four tabs extending away from said base in said second direction.

11. A heat sink for conducting heat from an electronic device comprising:
    a base for mounting said heat sink to a board; and
    means for retaining an electronic device, said means including a U-shaped member having first and second walls connected by a top ridge, said first wall extending outwardly from said base and said second wall having a terminus portion proximate said first wall.

12. A heat sink for conducting heat from an electronic device comprising:
    a mounting base;
    two U-shaped members, each having first and second walls integral with a top ridge, said first wall being integral with said base and extending outwardly therefrom and said second wall having a terminus portion proximate said first wall; wherein an electronic device is retainable between said first wall and terminus portion of each of aid U-shaped members for heat conduction from said device directly into said first and second walls;
    fastening means for attaching said base to a circuit board; wherein said fastening means includes at least one pin attached to said base and extending outwardly therefrom in a second direction opposite said first wall; and
    standoff means for maintaining a space between said base and said board when said sink is mounted on said board.

13. The heat sink of claim 12 wherein said standoff means includes four tabs extending away from said base in said second direction.

14. The heat sink of claim 1 wherein said means for retaining an electronic device includes a second U-shaped member having first and second walls connected by a top ridge, said first wall being integral with said base and extending outwardly therefrom and said second wall having a terminus portion proximate said first wall;
    wherein an electronic device is retainable between said first wall and terminus portion of said second U-shaped member for heat conduction from said device directly into said first and second walls.

15. A heat sink for conducting heat from an electronic device comprising:
    a base for mounting said heat sink to a board; and
    means for retaining an electronic device between a first wall and a terminus portion, said means including a U-shaped member including said first wall and terminus portion and further including a second wall connected to said first wall by a top ridge, said first wall extending outwardly from said base, and said second wall terminating in said terminus portion.

16. The heat sink of claim 15 further comprising second means for retaining a second electronic device, wherein said second means includes a second U-shaped member having first and second walls connected by a top ridge, said first wall extending outwardly from said base and said second wall having a terminus portion proximate said first wall.

17. The heat sink of claim 16 wherein an electronic device is retainable between said first wall and terminus portion of each of said U-shaped members for heat conduction from said device directly into said first and second walls.

* * * * *